(12) United States Patent
Yamazaki et al.

(10) Patent No.: US 6,735,077 B2
(45) Date of Patent: May 11, 2004

(54) THERMAL DIFFUSER AND RADIATOR

(75) Inventors: Naoya Yamazaki, Kawasaki (JP); Kazuhiro Iino, Kawasaki (JP); Takashi Shirakami, Kawasaki (JP); Yoshiaki Tada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/074,336

(22) Filed: Feb. 12, 2002

(65) Prior Publication Data
US 2003/0063441 A1 Apr. 3, 2003

(30) Foreign Application Priority Data
Oct. 1, 2001 (JP) .......................................... 2001-305425

(51) Int. Cl.[7] ................................................ H05K 7/20
(52) U.S. Cl. ....................... 361/689; 361/699; 361/700; 257/706; 257/707; 257/714; 174/15.1; 174/16.1; 174/16.3; 165/80.3; 165/80.4; 165/104.26
(58) Field of Search ................................ 361/698, 699, 361/700, 704, 711; 257/706, 707, 712–715; 174/15.1, 15.2; 165/80.4, 104.19, 104.21, 104.33

(56) References Cited

U.S. PATENT DOCUMENTS

| | | | |
|---|---|---|---|
| 4,686,606 A | * | 8/1987 | Yamada et al. ............... 361/699 |
| 5,268,812 A | * | 12/1993 | Conte ........................... 361/698 |
| 5,308,920 A | * | 5/1994 | Itoh ............................. 174/15.2 |
| 5,508,884 A | * | 4/1996 | Brunet et al. ................ 361/698 |
| 5,761,037 A | * | 6/1998 | Anderson et al. ............ 361/700 |
| 5,769,154 A | * | 6/1998 | Adkins et al. .......... 165/104.26 |
| 5,801,442 A | * | 9/1998 | Hamilton et al. ............ 257/714 |
| 5,880,524 A | * | 3/1999 | Xie .............................. 257/704 |
| 5,915,463 A | * | 6/1999 | Romero et al. ............. 165/80.3 |
| 5,933,323 A | * | 8/1999 | Bhatia et al. ................ 361/700 |
| 5,944,093 A | * | 8/1999 | Viswanath .............. 165/104.26 |
| 5,947,193 A | * | 9/1999 | Adkins et al. .......... 165/104.26 |
| 6,082,443 A | * | 7/2000 | Yamamoto et al. ..... 165/104.26 |
| 6,085,831 A | * | 7/2000 | DiGiacomo et al. ... 165/104.33 |
| 6,253,835 B1 | * | 7/2001 | Chu et al. ................... 165/80.4 |
| 6,418,019 B1 | * | 7/2002 | Snyder et al. ............... 361/700 |

FOREIGN PATENT DOCUMENTS

EP 000251836 A1 * 1/1988 .................. 257/714

* cited by examiner

*Primary Examiner*—Boris Chervinsky
(74) *Attorney, Agent, or Firm*—Katten Muchin Zavis Rosenman

(57) ABSTRACT

The present invention relates to a thermal diffuser which having a path for close thermal coupling uniformly between an electronic component mounted in an electronic equipment and a desired thermal conductor, and also to a radiator for radiating heat generated in this electronic component via the thermal diffuser. The object of the present invention is to realize flexible adaptability to various devices which are to undergo temperature control at low cost, and to efficiently achieve the temperature control. For this purpose, the thermal diffuser of the present invention has a plate-shaped structure which can be welded or bonded to the case of the electronic component to undergo heat exchange with the exterior and has a channel formed in mesh by a plurality of protrusions with confined heat medium recirculating therethrough.

42 Claims, 11 Drawing Sheets

THERMAL DIFFUSER AND RADIATOR

BACKGROUND OF THE INVENTION

1. Field of the Invention

The present invention relates to a thermal diffuser for uniformly forming a path for close thermal coupling between a mounted electronic component and a surface of a desired thermal conductor in an electronic equipment and to a radiator for radiating heat generated in this electronic component via the thermal diffuser.

2. Description of the Related Art

In recent years, a 'tunable OS (optical sender)' outputting an optical signal with a prescribed wavelength stably and precisely has been in practical use owing to positive application of a technique of precisely controlling operating temperature, and consequently, a WDM (wavelength division multiplexing) transmission method is being positively applied to various transmission systems as well as to relay transmission systems such as submarine optical transmission.

FIG. 9 is a view showing a configuration example of a node in which the tunable OS is mounted.

In FIG. 9, the tunable OS 90 is disposed on a printed circuit board 92 constituting a package attachable to and detachable from a predetermined slot of a shelf (a rack is also acceptable) 91.

FIG. 10 is a view showing the configuration of a radiation system of the tunable OS.

In FIG. 10, inside the tunable OS 90 disposed on the aforesaid printed circuit board 92, provided is a tunable laser diode module (hereinafter, referred to as a 'TLD module') 94 which is connected with one end of an optical fiber 93 and has close thermal coupling with a case 90C of this tunable OS.

An outer wall opposite to an outer wall facing the printed circuit board 92, out of outer walls of the case 90C, is bonded to one surface of a plate-shaped flat heat pipe 95 and the other surface of this flat heat pipe 95 is bonded to a bottom surface (supposed to be a specific surface on which no radiation fin is formed for simplification here) of a heat sink 96.

The TDL module 94 is composed of the following elements.

a case 94C thermally coupled with the aforesaid case 90C (supposed to be in close contact with it for simplification here)

a peltier 97 having close thermal coupling with the inner wall of the case 94C a laser diode 98 having close thermal coupling with a predetermined place of a surface of this peltier 97 an optical system 99 optically coupled with an emission port of this laser diode 98 and the aforesaid one end of the optical fiber 93.

In the conventional example having the configuration as described above, a laser beam emitted by the laser diode 98 is led to a not-shown wavelength-division multiplexing part via the optical system 99 and the optical fiber 93. Note that the present invention does not relate to a wavelength of the above laser beam and processing for wavelength-division multiplexing (may include modulation to be executed for each wavelength) executed by the wavelength-division multiplexing part and therefore, the explanations thereof are omitted here.

Meanwhile, heat generated in the laser diode 98 in the process in which the aforesaid laser beam is emitted is once absorbed by the peltier 97 and transferred to the flat heat pipe 95 via the cases 94C and 90C.

Then, the flat heat pipe 95 leads thus transferred heat to each part of the bottom surface of the heat sink 96 via a heat medium (coolant) injected into linear channels which are formed in parallel to each other inside the flat heat pipe 95 as shown by the dotted line in the upper part of FIG. 10 and whose atmospheric pressure is reduced to a predetermined value.

The heat sink 96 radiates thus led heat to an exterior via the radiation fin formed on a predetermined outer wall of the heat sink 96.

In short, the heat generated in the laser diode 98 is absorbed by the peltier 97 according to power supplied to the peltier 97 and radiated to the exterior via the cases 94C and 90C, the flat heat pipe 95, and the heat sink 96.

Therefore, the characteristics of the laser diode 98 and the optical system 99 are stably maintained and the aforesaid wavelength of the laser beam is maintained at a prescribed value as long as temperature is controlled properly via the peltier 97.

Incidentally, in the conventional example described above, the heat generated in the laser diode 98 and transferred to the flat heat pipe 95 via the peltier 97 and the cases 94C and 90C is transferred to the bottom surface of the heat sink 96 via the heat medium injected individually into the plural linear channels which are formed in parallel inside the flat heat pipe 95 as described above.

Therefore, most of the above heat is transferred to the heat sink 96 via the heat medium injected only to specific channels having close thermal coupling with the peltier 97, out of the channels formed inside the flat heat pipe 95, via the cases 90C and 94C.

Consequently, thermal conductivity between the peltier 97 (the laser diode 98) and each part of the bottom surface of the heat sink 96 is not uniform as shown in FIG. 11 and the most of the heat generated in the laser diode 98 is transferred to this heat sink 96, for example, via regions of the bottom surface of this heat sink 96, having close thermal coupling with the peltier 97.

Incidentally, the above thermal conductivity between the peltier 97 (the laser diode 98) and each part of the bottom surface of the heat sink 96 can be made uniform, for example, when a single chamber into which a coolant is injected and whose atmospheric pressure is set at a predetermined value is formed to occupy the whole area inside the flat heat pipe 95.

However, mechanical strength of the flat heat pipe 95 in which this chamber is formed is lowered to a great extent unless the flat heat pipe 95 is formed of a strong material or is formed to have a large thickness. Furthermore, a prescribed value is not always obtained in efficiency of heat exchange achieved by the flat heat pipe 95 since adequate capillary attraction (capillary pressure) for promoting recirculation of the heat medium inside the chamber is not gained.

Moreover, in the conventional example, the flat heat pipe 95 is joined with the surface of the corresponding outer wall of the case 90C and the bottom surface of the heat sink 96 via adhesive, which requires many man-hours in its assembly and brings about restrictions not only on decrease in thermal conductivity due to applicable adhesive but also on reduction in total thickness, and consequently, a prescribed cooling capacity is not always achieved.

However, improvement in reliability and performance, cost reduction, and downsizing are not only objects of nodes to which the aforesaid wavelength-division multiplexing method is applied but also objects common to various equipments such as the tunable OS 90 whose temperature is to be precisely controlled, and therefore, there has been a strong demand for a technique flexibly applicable to high density assembly of various devices.

Incidentally, a prescribed cooling capacity can be achieved by forming the cases 94C and 90C of metallic material having high thermal conductivity such as copper alloy.

However, since such metallic material generally has a large specific gravity and is higher cost compared with aluminum and the like, it has been difficult to be applied in practical use.

Furthermore, the aforesaid decrease in thermal conductivity due to the adhesive is avoidable, for example, when the peltier 97 and the cases 94C and 90C have close thermal coupling with the flat heat pipe 95 via a metallic screw or the like.

However, when a hole through which the above screw is to pass (or to be screwed) is formed in the flat heat pipe 95, the aforesaid channels should be formed not to pass this hole.

Consequently, the channels are prevented from being formed linearly to cause structure complexity, and furthermore, since a place where the threaded hole is to be formed is originally a region which should have close thermal coupling with the channels (the heat medium), it is highly possible that the cooling capacity decreases more as the diameter and the number of the screws to be applied are larger.

SUMMARY OF THE INVENTION

It is an object of the present invention to provide a thermal diffuser and a radiator flexibly adaptable to various devices as subjects of temperature control and capable of achieving the temperature control highly efficiently without causing great increase in cost.

It is another object of the present invention to realize efficient and stable thermal diffusion or concentration without decreasing mechanical strength.

It is still another object of the present invention to realize efficient radiation of heat compared with a case in which a large amount of the heat is transferred to one specific region of a joint surface with a thermal diffuser.

It is yet another object of the present invention to realize flexible adaptability to various modes of maintenance and operation, and to suppress factors, such as the vaporization, expansion, coagulation, and so on, of a heat medium which may possibly occur according to temperature and atmospheric pressure and obstruct the process of assembly and mounting.

Moreover, it is yet another object of the present invention to improve efficiency in thermal diffusion compared with a case in which density of a channel formed in a region near a device or a circuit to undergo heat exchange is low.

Furthermore, it is yet another object of the present invention to reduce the cost and simplify the configuration.

Moreover, it is yet another object of the present invention to improve efficiency and responsiveness in heat diffusion.

Furthermore, it is yet another object of the present invention to realize flexible adaptability to the shape and size of an electronic component to greatly ease restrictions on thermal design and mounting of an equipment which includes the electronic component.

Moreover, it is yet another object of the present invention to improve efficiency and responsiveness in thermal diffusion compared with a case in which no capillary attraction acts on a heat medium.

Furthermore, it is yet another object of the present invention to realize flexible adaptability to various shapes and layouts of an electronic component and to ensure close thermal coupling between the electronic component and a channel.

Moreover, it is yet another object of the present invention to maintain total high reliability.

Furthermore, it is yet another object of the present invention to maintain high efficiency and stability in thermal diffusion.

Moreover, it is yet another object of the present invention to ease restrictions on design, manufacturing, maintenance, and operation of an equipment and a system to which the invention is applied, and to improve and stably maintain the performance and reliability of the equipment and the system.

The above-described objects are achieved by a thermal diffuser having a plate-shaped structure which can be welded or bonded to the case of an electronic component to undergo heat exchange with an exterior and has a channel formed in mesh by a plurality of protrusions and through which a heat medium confined in the interior recirculates.

In the thermal diffuser as structured above, the channel through which the heat medium recirculates can be stably formed as long as the strength of the channel against a difference in atmospheric pressure between its interior and exterior and against a physically given force from the exterior is secured by the aforesaid welding or bonding.

The above-described objects are also achieved by a thermal diffuser which is structured as a housing having an outer wall capable of being thermally coupled with the case of an electronic component to undergo heat exchange with an exterior.

In the thermal diffuser as structured above, a channel through which a heat medium recirculates can be stably formed as long as the strength of the housing against a difference in atmospheric pressure between its interior and exterior and against a physically given force from the exterior is secured by protrudingly disposing the aforesaid protrusions on the inner wall of the housing.

The above-described objects are also achieved by a thermal diffuser which is structured as a frame formed integrally with the case of an electronic component which is to undergo heat exchange with an exterior.

In the thermal diffuser as structured above, a channel through which a heat medium recirculates is stably formed as long as the strength of the frame against a difference in atmospheric pressure between its interior and exterior and against a physically given force from the exterior is secured by protrudingly disposing the aforesaid protrusions on the inner wall of the frame.

The above-described objects are also achieved by a thermal diffuser which is provided with a heat medium injection path used for injecting the heat medium to the channel from the exterior.

In the thermal diffuser as structured above, it is possible to freely exchange, inject and add the heat medium to the channel as long as the heat medium injection path can be opened and closed.

The above-described objects are also achieved by a thermal diffuser in which the channel is thickly formed in a region near a device or a circuit which is to undergo heat exchange.

In the thermal diffuser as structured above, the more thickly formed the channel is, the closer thermal coupling with the electronic component the heat medium injected into the channel has.

The above-described objects are also achieved by a thermal diffuser in which the channel is formed with uniform density in a region distant from a device or a circuit which is to undergo heat exchange.

In the thermal diffuser as structured above, the configuration simplification and cost reduction can be realized by standardizing the layout of sections of the channel other than a section closely thermally coupled with the electronic component.

The above-described objects are also achieved by a thermal diffuser in which a channel is also formed between all or a part of the top parts of the plurality of protrusions and the inner wall.

In the thermal diffuser as structured above, a bypass is formed in the channel via all or a part of the top parts of the protrusions so that the heat medium injected into this channel is swiftly diffused and recirculates via a channel consisting of the channel and the bypass arranged in mesh.

The above-described objects are also achieved by a thermal diffuser in which all or a part of the plurality of protrusions are formed in a partially contracted pillar or wedge shape.

In the thermal diffuser as structured above, the channel is formed with high density or formed in mesh even when the aforesaid inner wall is small, as long as molding of the protrusions is possible.

The above-described objects are also achieved by a thermal diffuser in which the ingredients, shapes, and sizes of the plurality of protrusions and/or the inner wall are determined to allow capillary attraction acting on the heat medium in the channel to exceed attraction acting on the heat medium.

In the thermal diffuser as structured above, it is able to enhance efficiency and responsiveness in thermal diffusion compared with a case in which no capillary attraction acts on the heat medium.

The above-described objects are also achieved by a thermal diffuser which comprises a medium poured in all or a part of sections of the channel, for increasing capillary attraction acting on the heat medium in the channel.

In the thermal diffuser as structured above, the more capillary attraction increases, the further promoted the recirculation of the heat medium in the channel is.

The above-described objects are also achieved by a thermal diffuser which has, in all or a part of the plural protrusions, a hole formed capable of joining and/or coupling the thermal diffuser with the case of the electronic equipment or a member used for fastening the thermal diffuser in order to maintain thermal coupling with the case.

In the thermal diffuser as structured above, the hole is formed in a desired protrusion which is to be joined or coupled with the aforesaid member or the case.

The above-described objects are also achieved by a thermal diffuser which comprises a member formed integrally with all or a part of the plurality of protrusions and capable of joining and/or coupling the thermal diffuser with the case or a member used for fastening the thermal diffuser in order to maintain thermal coupling with the case of the electronic component.

In the thermal diffuser as structured above, the member is integrally formed with a desired protrusion which is to be joined or coupled with the member or the case.

The above-described objects are also achieved by a thermal diffuser in which a total amount of the heat medium is determined to be an amount which enables the heat medium to steadily recirculate in a part of the channel having the closest thermal coupling with the electronic component.

In the thermal diffuser as structured above, the heat exchange is stably and continuously performed via the heat medium.

The above-described objects are also achieved by a thermal diffuser in which the outer wall has a region as a thermal conduction path for transferring heat to a specific member, the region with a shape and an ingredient such that the degree of thermal coupling with the specific member becomes a desired value.

In the thermal diffuser as structured above, it is avoided that the thermal resistance increases undesirably due to deviation and distortion in the shape of the outer wall.

The above-described objects are also achieved by a radiator which comprises any of the above thermal diffusers and a heat radiating member for radiating heat transferred via the thermal diffuser to an exterior.

In the radiator as structured above, the heat is diffused via a case and a heat medium injected into the channel formed in mesh, and it is transferred to the heat radiating member without a large amount of the heat being diffused to one specific region of the outer wall of the thermal diffuser.

The above objects are also achieved by a radiator in which a heat radiating member is integrally formed with the thermal diffuser.

In the radiator as structured above, the above heat is diffused via a case and a heat medium injected into the channel formed in mesh, and it is transferred to the heat radiating member without a large amount of the heat being diffused to one specific region of the outer wall of the thermal diffuser.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

The principle of a thermal diffuser according to the present invention is first explained.

Figure 1:
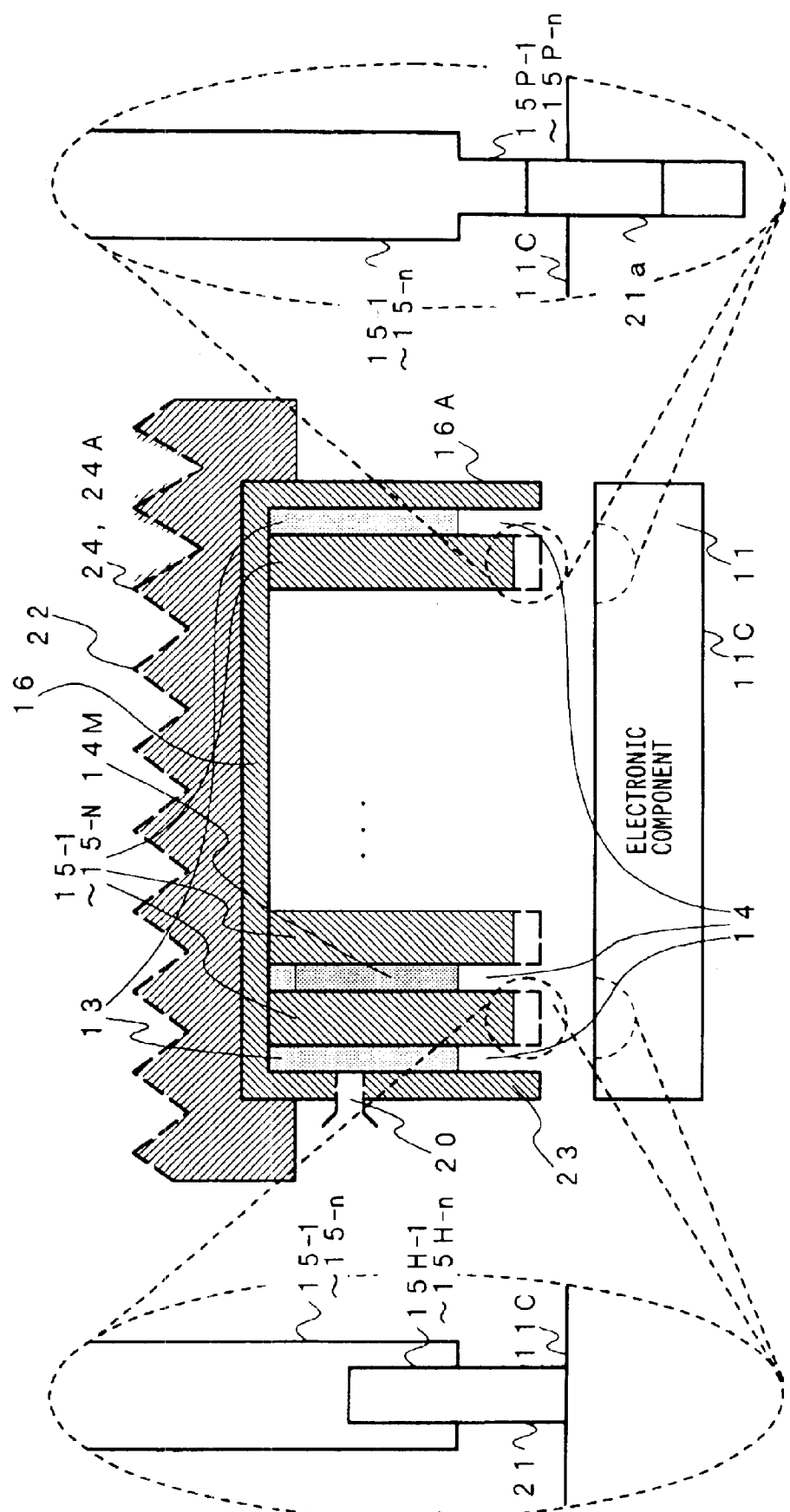
FIG. 1 is a block diagram of a first principle of the present invention.

FIG. 1 is a block diagram of a first principle of the present invention.

A thermal diffuser shown in FIG. 1 is composed of a plate-shaped structure 16, protrusions 15-1 to 15-N with holes 15H-1 to 15H-n formed respectively in tips thereof, and a wall 16A forming a channel 14 in a mesh together with these protrusions 15-1 to 15-N.

The principle of a first thermal diffuser according to the present invention is described as follows.

The plate-shaped structure 16 is welded or bonded via the wall 16A to a case 11C of an electronic component 11 which is to undergo heat exchange with an exterior. In a region surrounded by the wall 16A, the case 11C, and the plate-shaped structure 16, the channel 14 through which a heat medium 13 used for the aforesaid heat exchange recirculates is formed in a mesh by the plural protrusions 15-1 to 15-N to confine the heat medium 13.

In other words, the plural protrusions 15-1 to 15-N are protrudingly provided in the region and the plate-shaped structure 16 is welded or bonded to the case 11C via the wall 16A so that it is able to increase the strength of the plate-shaped structure 16 against a difference in atmospheric pressure between the region and the exterior and against a force which can be physically given thereto from the exterior.

Furthermore, the heat medium 13 recirculates via the channel 14 which is formed in a mesh as described above.

Consequently, a reversible heat exchange path is formed between all of the regions of the surface of the plate-shaped structure 16 having close thermal coupling with the channel 14, and the electronic component 11 via the heat medium 13 injected into the channel 14 and via the case 11C, without decreasing the mechanical strength, and efficient thermal diffusion or concentration is realized by the heat exchange path.

Figure 2:
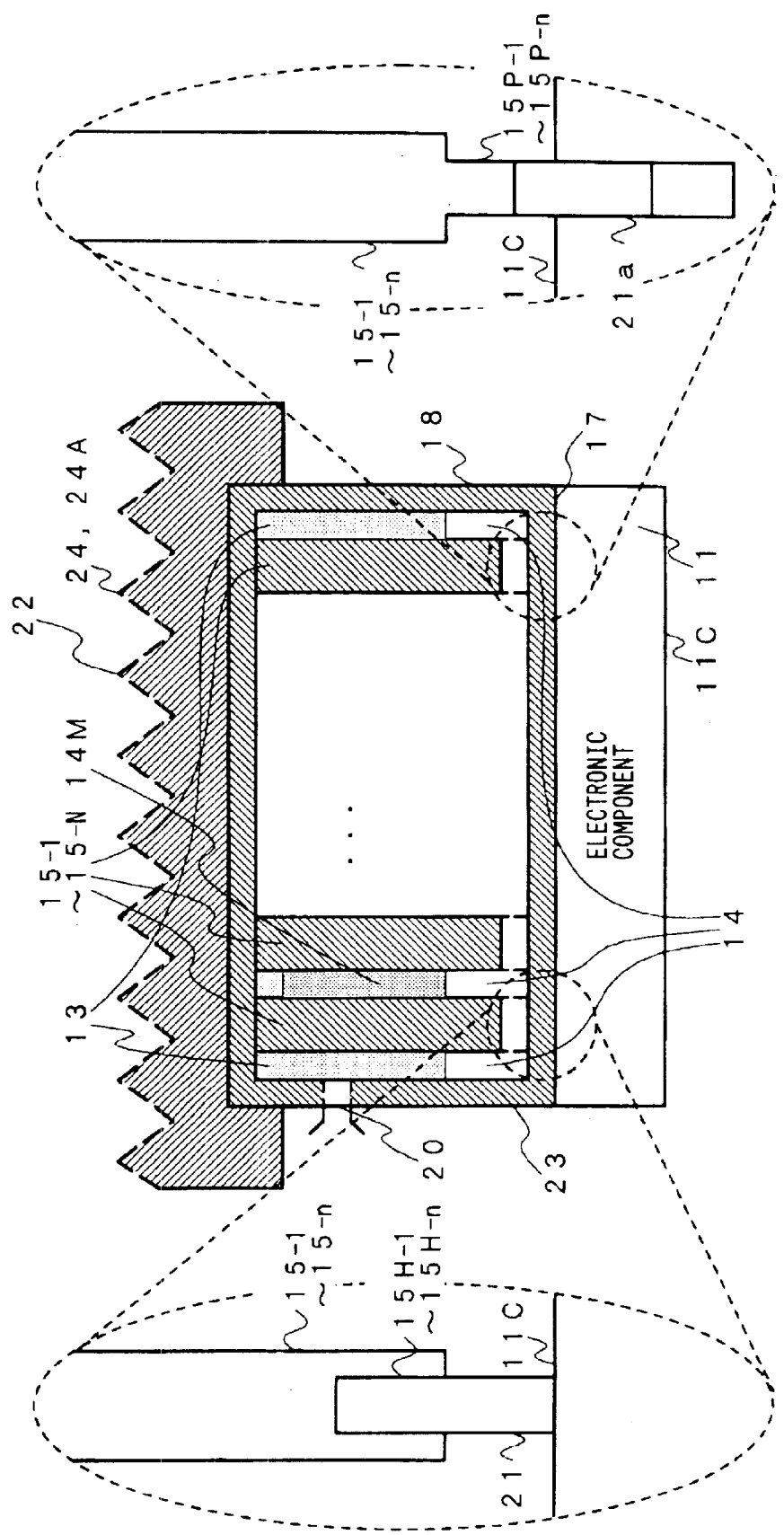
FIG. 2 is a block diagram of a second principle of the present invention.

FIG. 2 is a block diagram of a second principle of the present invention.

A thermal diffuser shown in FIG. 2 is composed of a housing 18, the protrusions 15-1 to 15-N, which are protrudingly provided on the inner wall of the housing 18, with the holes 15H-1 to 15H-n formed respectively in the tips thereof, and an outer wall 17 forming the channel 14 in a mesh together with these protrusions 15-1 to 15-N.

The principle of a second thermal diffuser according to the present invention is described as follows.

The outer wall 17 of the housing 18 is thermally coupled with the case 11C of the electronic component 11 which is to undergo heat exchange with an exterior of the housing 18. On the inner wall of the housing 18, the channel 14 through which the heat medium 13 used for the heat exchange recirculates is formed in a mesh by the plural protrusions 15-1 to 15-N protrudingly provided on the inner wall. Furthermore, the housing 18 has thermal resistance at such a value that the heat exchange can be achieved between the channel 14 as structured above and the exterior.

In other words, the plural protrusions 15-1 to 15-N are protrudingly provided on the inner wall of the housing 18 so that it is able to increase the strength of the housing 18 against a difference in atmospheric pressure between the interior and the exterior of the housing 18 and against a force which can be physically given thereto from the exterior.

Furthermore, the heat medium 13 recirculates via the channel 14 which is formed in a mesh as described above.

Consequently, a reversible heat exchange path is formed between all of the regions of the surface of the housing 18 having close thermal coupling with the channel 14, and the electronic component 11 via the heat medium 13 injected into the channel 14 and via the case 11C without decreasing the mechanical strength, and the efficient thermal diffusion or concentration is realized by the heat exchange path.

Figure 3:
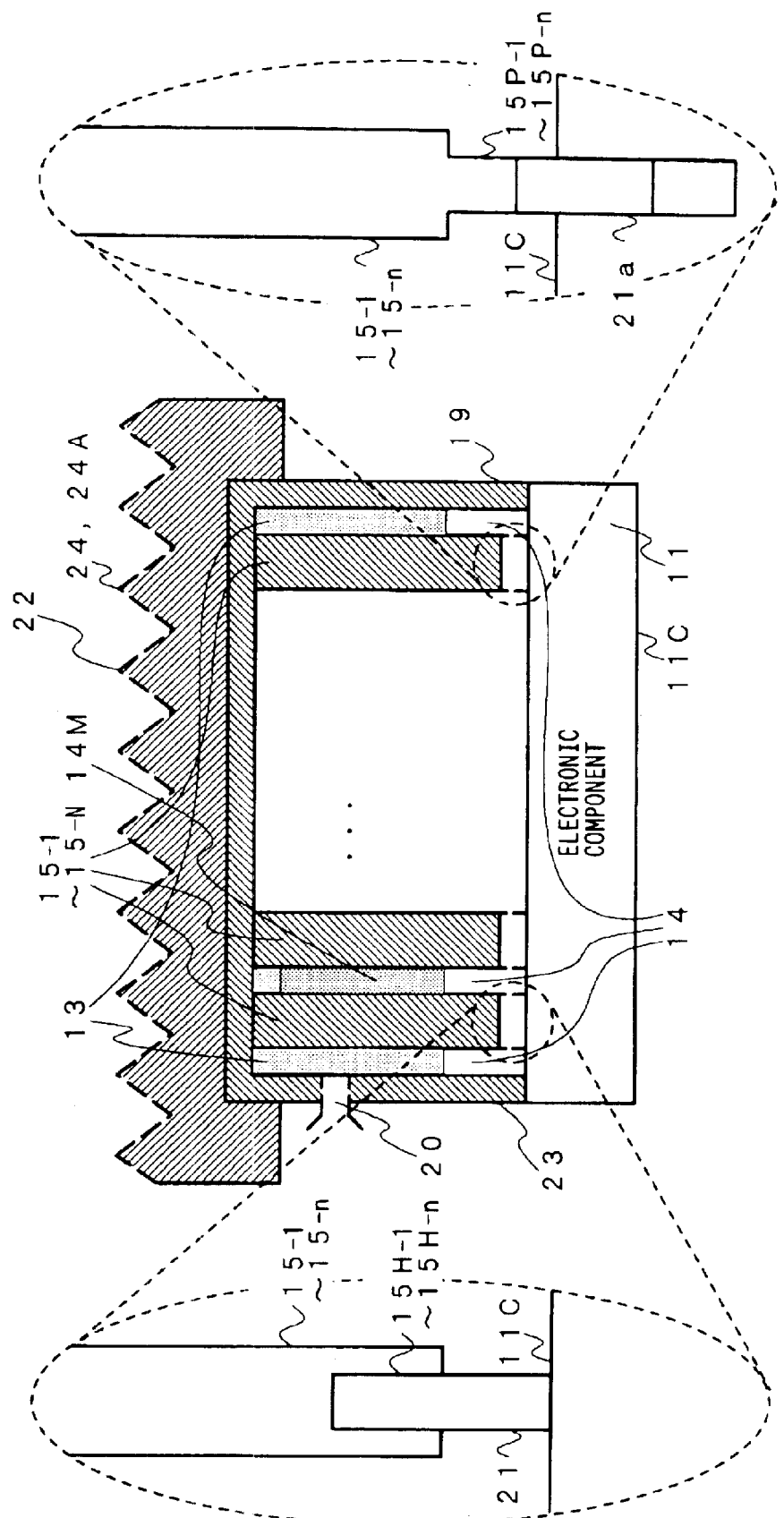
FIG. 3 is a block diagram of a third principle of the present invention.

FIG. 3 is a block diagram of a third principle of the present invention.

A thermal diffuser shown in FIG. 3 is composed of a frame 19, the protrusions 15-1 to 15-N, which are protrudingly provided on the inner wall of the frame 19, with the holes 15H-1 to 15H-n formed respectively in the tips thereof, and the wall 16A forming the channel 14 in a mesh together with these protrusions 15-1 to 15-N.

The principle of a third thermal diffuser according to the present invention is described as follows.

The frame 19 is integrally formed with the case 11C of the electronic component 11 which is to undergo heat exchange with the exterior of the frame 19. On the inner wall of the frame 19, the channel 14 through which the heat medium 13 used for the heat exchange recirculates is formed in a mesh by the plural protrusions 15-1 to 15-N protrudingly provided on the inner wall. Furthermore, the frame 19 has thermal resistance at such a value that the heat exchange can be achieved between the channel 14 as structured above and the exterior.

In other words, the plural protrusions 15-1 to 15-N are protrudingly provided on the inner wall of the frame 19 so that it is able to increase the strength of the frame 19 against a difference in atmospheric pressure between the interior and the exterior of the frame 19 and against a force which can be physically given thereto from the exterior.

Furthermore, the heat medium 13 recirculates via the channel 14 which is formed in a mesh as described above.

Consequently, a reversible heat exchange path is formed between all of the regions of the surface of the frame 19 having close thermal coupling with the channel 14, and the electronic component 11 via the heat medium 13 injected into the channel 14 and via the case 11C without decreasing the mechanical strength, and the efficient thermal diffusion or concentration is realized by the heat exchange path.

The principle of a fourth thermal diffuser according to the present invention is described as follows.

A heat medium injection path 20 is formed in the inner wall and used for injecting the heat medium 13 into the channel 14 from the exterior.

In other words, the heat medium 13 can be freely exchanged, injected and added to the channel 14 as long as the heat medium injection path 20 can be opened and closed.

Therefore, it is possible to realize flexible adaptability to various modes of maintenance and operation, and to suppress factors, such as the vaporization, expansion, coagulation, and so on, of the heat medium 13 which may possibly occur according to temperature and atmospheric pressure and obstruct the process of assembly and mounting.

The principle of a fifth thermal diffuser according to the present invention is described as follows.

The channel 14 is thickly formed in a region near a device or a circuit which is provided in the electronic component 11 and is to undergo heat exchange.

In other words, the heat medium 13 injected into the channel 14 has closer thermal coupling with the electronic component 11 as the channel 14 formed in the aforesaid region is more thickly formed.

Therefore, the efficiency in thermal diffusion is enhanced compared with a case in which the density is low.

The principle of a sixth thermal diffuser according to the present invention is described as follows.

The channel 14 is formed with uniform density in a region distant from a device or a circuit which is provided in the electronic component 11 and is to undergo heat exchange.

In other words, the layout of sections of the channel 14 other than a section having close thermal coupling with the electronic component 11 is standardized, which realizes the configuration simplification and cost reduction.

The principle of a seventh thermal diffuser according to the present invention is described as follows.

All or a part of the plural protrusions 15-1 to 15-N have a shape and a size large enough to have a channel formed also on the top parts thereof.

In other words, a bypass is formed in the channel 14 via all or a part of the top parts of the protrusions 15-1 to 15-N, and the heat medium 13 injected into the channel 14 is flexibly and swiftly diffused and recirculates via a mesh-type channel consisting of the channel 14 and the bypass.

Therefore, efficiency and responsiveness in thermal diffusion can be enhanced.

The principle of an eighth thermal diffuser according to the present invention is described as follows.

All or a part of the plural protrusions 15-1 to 15-N are formed in a partially contracted pillar or wedge shape.

In other words, the channel 14 is formed with high density or formed in a mesh even when the aforesaid inner wall is small, as long as molding of these protrusions 15-1 to 15-N is possible.

Therefore, it is possible to realize flexible adaptability to the shape and size of the electronic component 11 and to substantially ease restrictions on thermal design and mounting of an equipment structured to include the electronic component 11.

The principle of a ninth thermal diffuser according to the present invention is described as follows.

The ingredients, shapes, and sizes of the plural protrusions 15-1 to 15-N and/or the inner wall are determined to allow recirculation of the heat medium 13 to be promoted due to capillary attraction acting on the heat medium 13 in the channel 14.

Therefore, efficiency and responsiveness in thermal diffusion can be enhanced compared with a case in which no capillary attraction acts on the heat medium 13.

The principle of a tenth thermal diffuser according to the present invention is described as follows.

A medium 14M is poured in all or a part of sections of the channel 14 and increases capillary attraction acting on the heat medium 13 in the channel 14.

In other words, the recirculation of the heat medium 13 in the channel 14 is further promoted by thus increased capillary attraction.

Therefore, the efficiency and responsiveness in thermal diffusion are further enhanced.

The principle of an eleventh thermal diffuser according to the present invention is described as follows.

The holes 15H-1 to 15H-n formed in all or a part of the plural protrusions 15-1 to 15-N are joined or coupled with the case 11C or a member 21 used for fastening the thermal diffuser in order to maintain thermal coupling with the case 11C.

The holes 15H-1 to 15H-n are formed in desired protrusions among the protrusions 15-1 to 15-N, which are to be joined or coupled with the member 21 or the case 11C.

Therefore, it is possible to realize flexible adaptability to various shapes and layouts of the electronic component 11 including the case 11C and to ensure close thermal coupling between the electronic component 11 and the channel 14.

The principle of a twelfth thermal diffuser according to the present invention is described as follows.

Members 15P-1 to 15P-n are joined or coupled with the case 11C or a member 21a used for fastening the thermal diffuser in order to maintain thermal coupling with the case 11C, and are integrally formed with all or a part of the plural protrusions 15-1 to 15-N individually.

The members 15P-1 to 15P-n as described above are integrally formed with desired protrusions, out of the protrusions 15-1 to 15-N, to be joined or coupled with the aforesaid member 21a or the case 11C.

Therefore, it is able to realize flexible adaptability to various shapes and layouts of the electronic component 11 including the case 11C and to ensure close thermal coupling between the electronic component 11 and the channel 14.

The principle of a thirteenth thermal diffuser according to the present invention is described as follows.

A total amount of the heat medium 13 is determined to be an amount which causes the heat medium 13 to steadily recirculate in a part of the channel 14 having the closest thermal coupling with the electronic component 11.

In other words, such heat exchange via the heat medium 13 is carried out stably and continuously.

Consequently, total reliability is highly maintained.

The principle of a fourteenth thermal diffuser according to the present invention is described as follows.

The outer wall has a shape and an ingredient such that the degree of thermal coupling with an exterior or a specific member 22 becomes a desired value.

Consequently, since it is avoided that the thermal resistance increases due to deviation and distortion in the shape of the outer wall, the efficiency and stability in thermal diffusion are highly maintained.

The principle of a first radiator according to the present invention is described as follows.

A radiating member 24 radiates heat generated in the electronic component 11 and transferred via a thermal diffuser 23 to an exterior of the radiating member 24.

The heat can be diffused via the case 11C and the heat medium 13 injected into the channel 14 formed in a mesh, and it is transferred to the radiating member 24, without a large amount of the heat being transferred to one specific region of the outer wall of the thermal diffuser 23.

Therefore, the radiating member 24 can efficiently radiate heat compared with a case in which a large amount of the heat is transferred to one specific region of the joint surface with the thermal diffuser 23.

The principle of a second radiator according to the present invention is described as follows.

A radiating member 24A radiates heat generated in the electronic component 11 and transferred thereto via the thermal diffuser 23 to an exterior of the radiating member 24A.

The above heat can be diffused via the aforesaid case 11C and the heat medium 13 injected into the channel 14 formed in a mesh, and it is transferred to the radiating member 24A, without a large amount of the heat transferred to one specific region of the outer wall of the thermal diffuser 23.

Therefore, the radiating member 24A can efficiently radiate heat compared with a case in which an unequally large amount of the heat is transferred to one specific region of the interface boundary with the thermal diffuser 23.

Embodiments of the present invention are explained below in detail with reference to the drawings.

Figure 4:
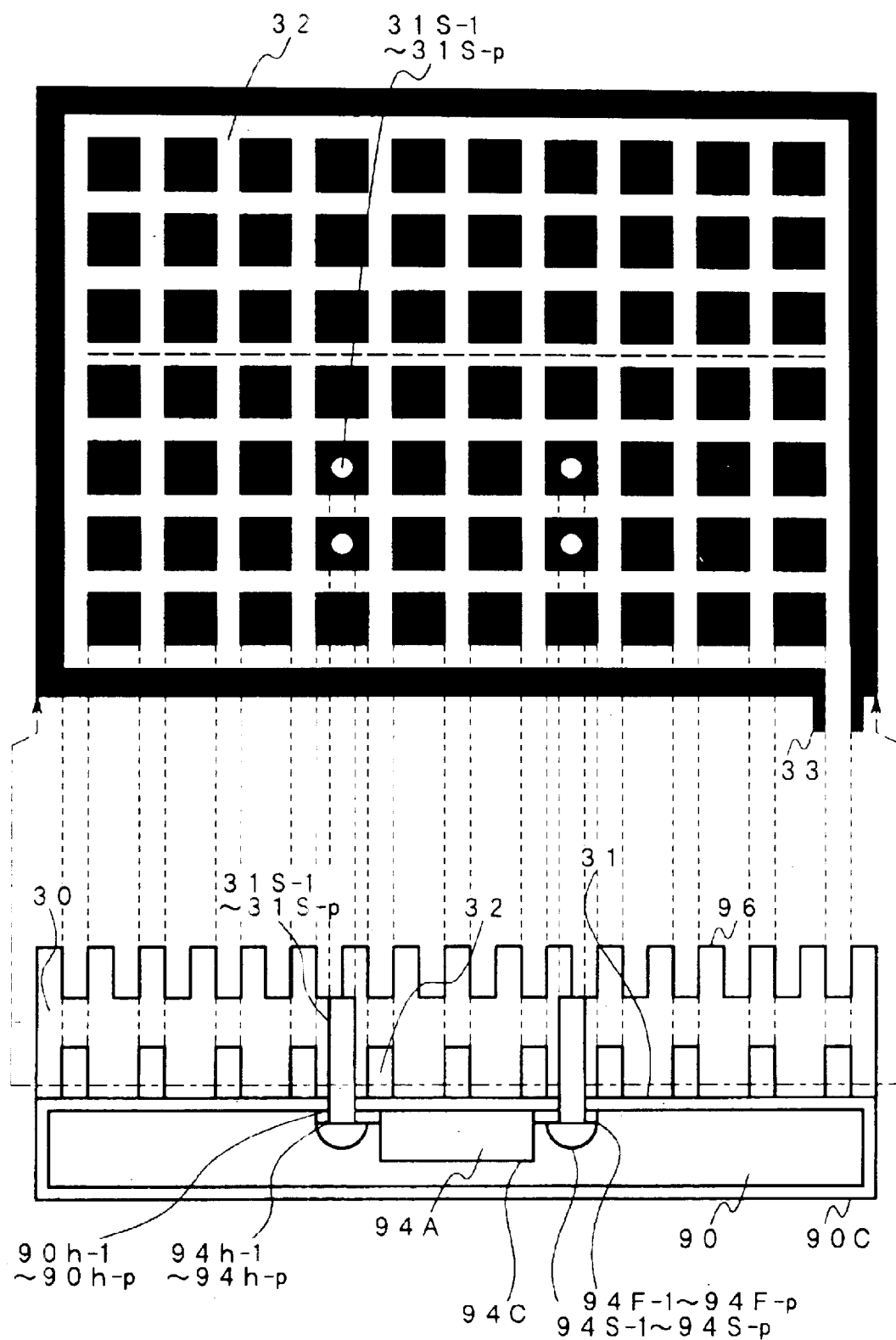
FIG. 4 is a view showing a first embodiment of the present invention.

FIG. 4 is a view showing a first embodiment of the present invention.

The first embodiment of the present invention is characterized by the following.

A later-described radiating member 30 is provided to substitute for the aforesaid flat heat pipe 95.

In the outer face of the case 94C of the TLD module 94, holes 94h-1 to 94h-p through which a plurality of screws 94S-1 to 94S-p used for fixing the case 94C pass respectively or flanges 94F-1 to 94F-p in which these holes 94h-1 to 94h-p are formed are formed.

In the case 90C, holes 90h-1 to 90h-p through which these screws 94S-1 to 94S-p pass respectively are formed.

Figure 10:
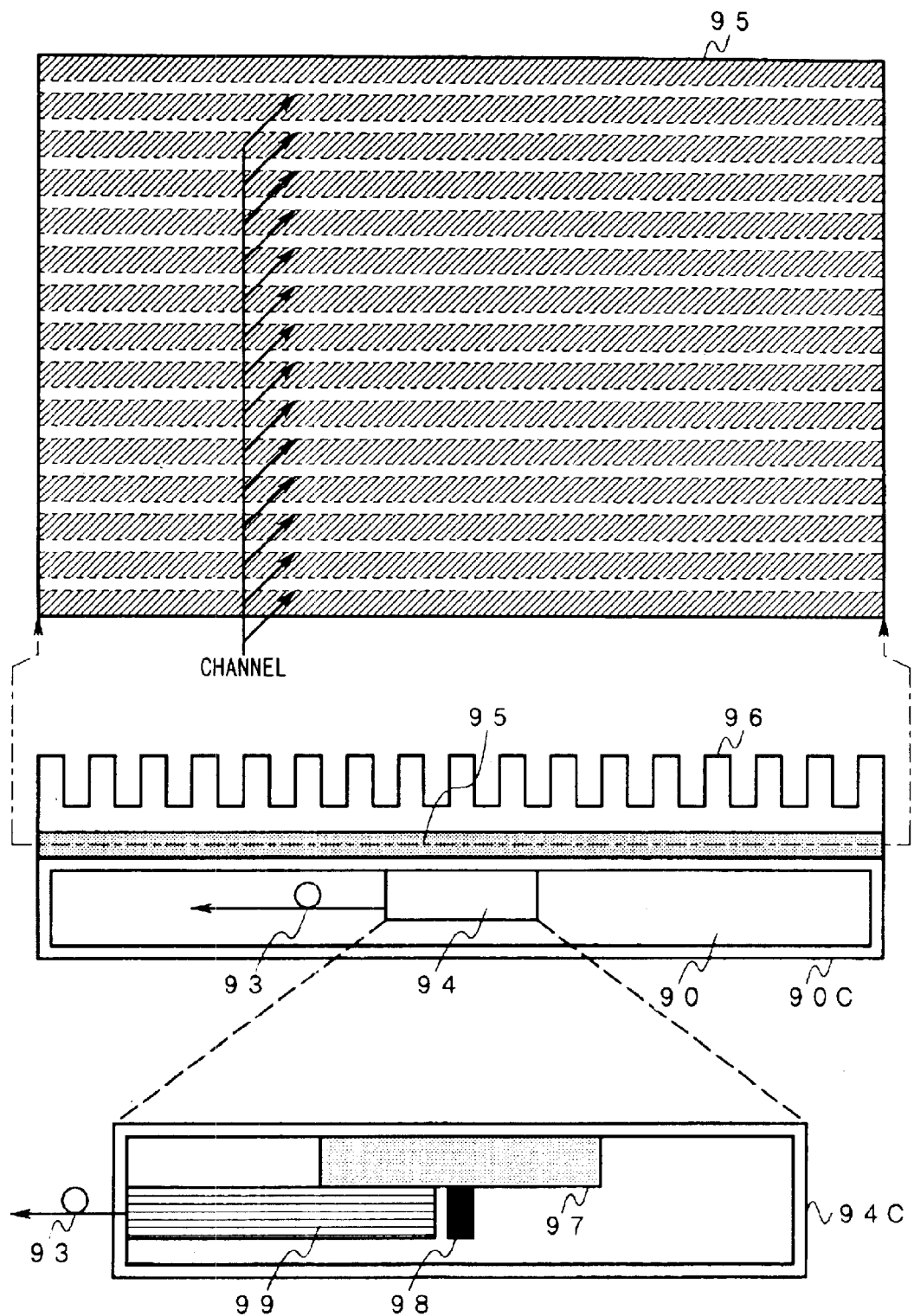
FIG. 10 is a view showing the configuration of a radiation system of the tunable OS.
Figure 11:
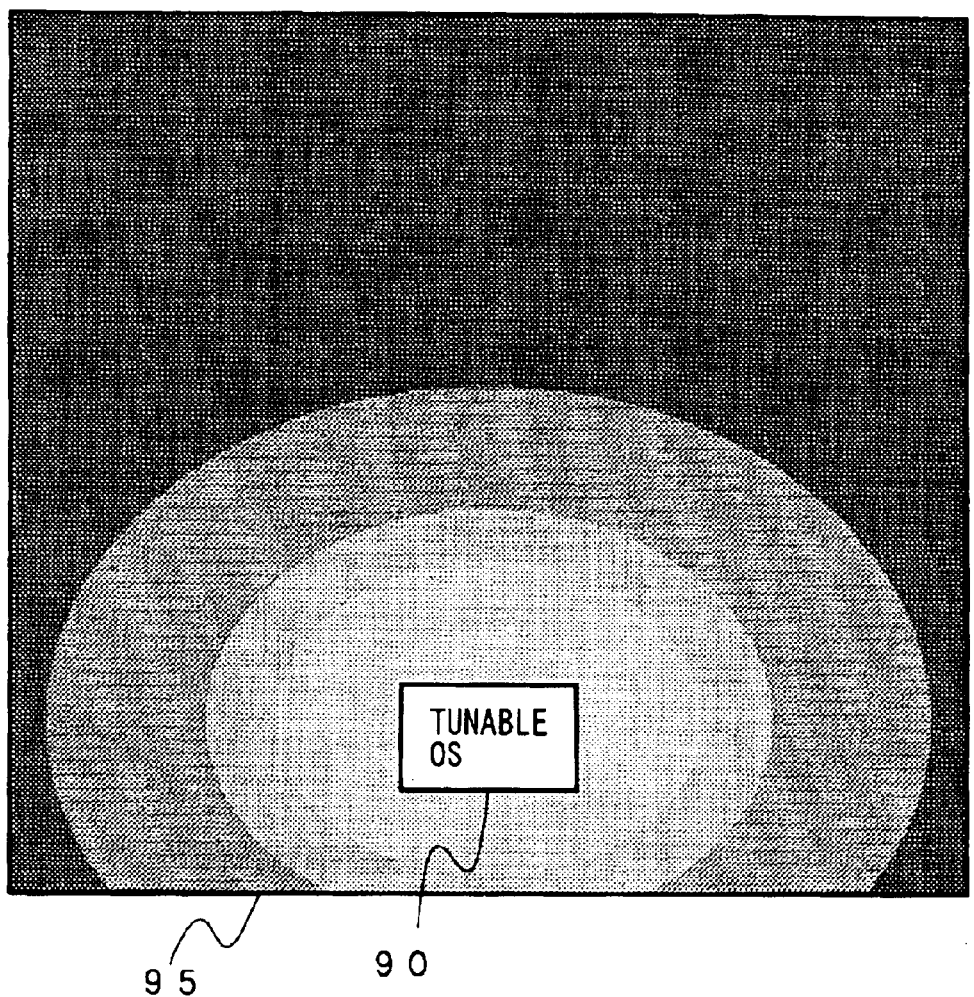
FIG. 11 is a view showing temperature distribution on a flat heat pipe 95 in a conventional example.

Furthermore, the radiating member 30 has the following thermal coupling plane 31, a channel 32, and a heat medium injection port 33.

the plane 31 integrally formed with the heat sink 96 shown in FIG. 10, having a shape closely contactable with a predetermined outer wall of the case 90C of the tunable OS 90, and having threaded holes 31S-1 to 31S-p, through which the aforesaid screws 94S-1 to 94S-p are screwed, formed therein (hereinafter referred to as a 'thermal coupling plane 31')

the channel 32 which is formed uniformly on the thermal coupling plane 31 in a lattice (or in a mesh) without passing these threaded holes 31S-1 to 31S-p and which is to serve as a path through which a later-described heat medium recirculates the heat medium injection port 33 which is formed between a predetermined place of this channel 32 and an exterior and whose aperture can be tightly closed via a member such as a valve or the like.

Incidentally, places of the thermal coupling plane 31, which correspond neither to the channel 32 or a marginal part of the thermal coupling plane 31 are hereinafter simply called 'projecting parts'.

In the first embodiment of the present invention, the radiating member 30 is attached to the case 90C of the tunable OS 90 based on the following procedure.

The screws 94S-1 to 94S-p inserted to the aforesaid holes 94h-1 to 94h-p and the holes 90h-1 to 90h-p respectively are screwed to the threaded holes 31S-1 to 31S-p.

The whole circumference of the marginal part of the thermal coupling plane 31 is brazed to the case 90C.

Therefore, the TLD module 94A which is to undergo heat radiation is kept in close contact with the case 90C and the projecting parts (the radiating member 30) by the screws 94S-1 to 94S-p which are screwed to the threaded holes 31S-1 to 31S-p integrally formed with the heat sink 96 and formed in the strong projecting parts.

Furthermore, the channel 32 is shielded from the exterior in a manner that a predetermined heat medium is injected into the channel 32 from the exterior via the heat medium injection port 33, and the heat medium injection port 33 is closed while the atmospheric pressure thereof is reduced to a predetermined value.

Meanwhile, inside the TLD module 94A, the heat generated in the laser diode 98 and transferred to the case 90C via the peltier 97 and the case 94C similarly to the conventional example is transferred to the projecting parts, which are in close contact with the case 90C as described above, and the channel 32 formed by these projecting parts.

Furthermore, the aforesaid heat medium is vaporized quickly due to the heat transferred to the channel 32.

The heat medium which is vaporized in this way is diffused quickly and substantially uniformly to all over the channel 32 since the channel 32 is formed in a lattice as described above.

In each part of the channel 32, heat exchange between the diffused heat medium and the heat sink 96 is carried out in parallel.

Figure 5:
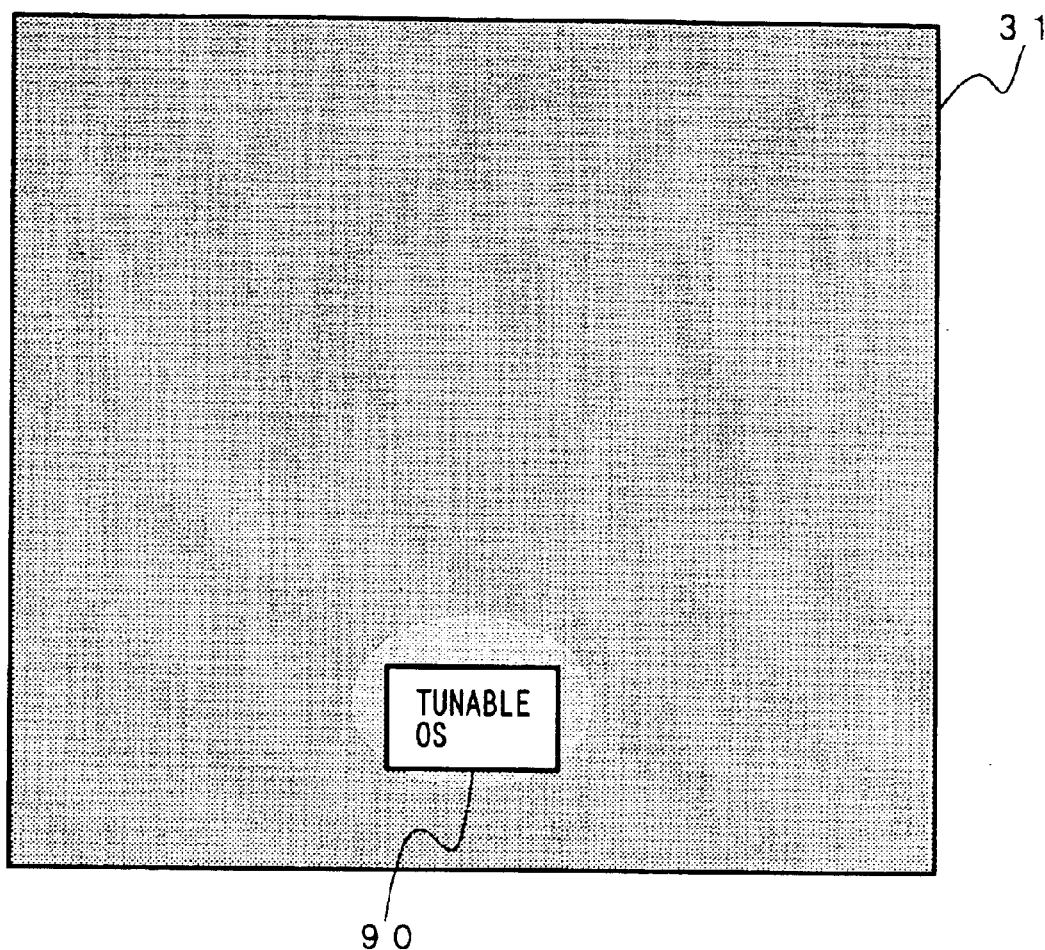
FIG. 5 is a view showing temperature distribution on a thermal coupling plane in the first embodiment of the present invention.

In other words, the TLD module 94A is mechanically fastened to the radiating member 30 firmly via the screws 94S-1 to 94S-p while having close thermal coupling with it via the case 90C, and furthermore, as shown in FIG. 5, it also has close thermal coupling uniformly with all the regions of a radiation fin provided in the heat sink 96 via the heat medium injected into the channel 32.

Figure 6:
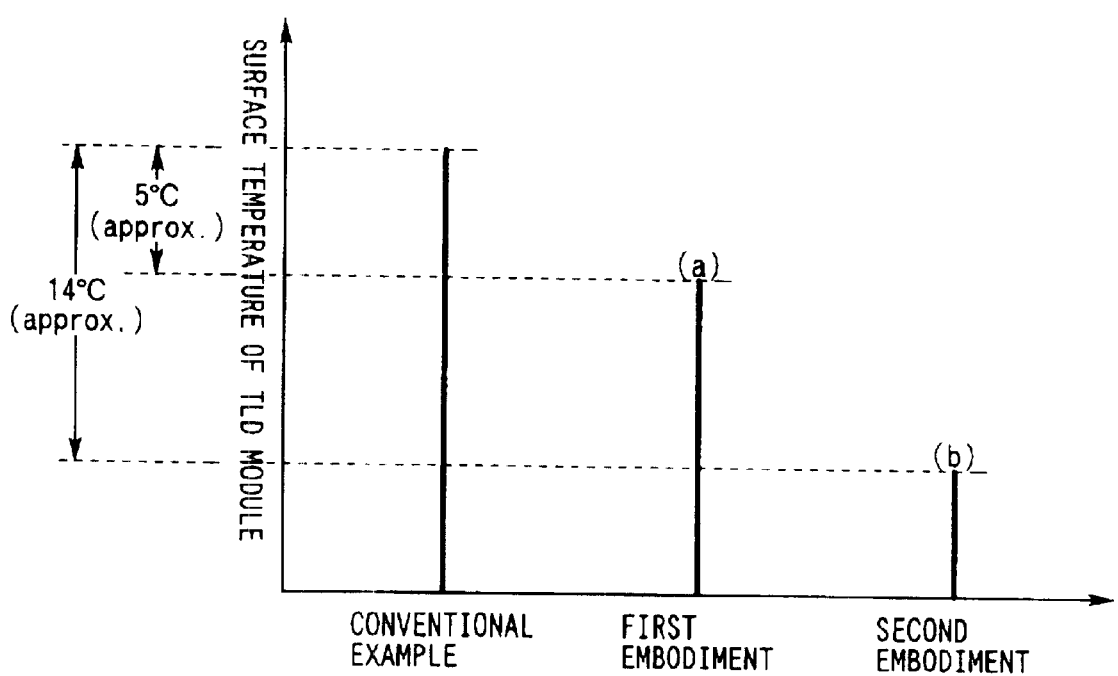
FIG. 6 is a chart showing effects of the first embodiment and a second embodiment of the present invention.

Therefore, according to this embodiment, surface temperature of the TLD module 94A is stably maintained at a low value compared with the conventional example as shown in FIG. 6(a).

Moreover, flexible adaptability to the layout of the TLD module 94A inside the tunable OS 90 and to the mechanical structure of this TLD module 94A is made possible so that restrictions on mounting and thermal design are greatly eased and heat is radiated more efficiently than in the conventional example without decrease in mechanical strength.

Figure 7:
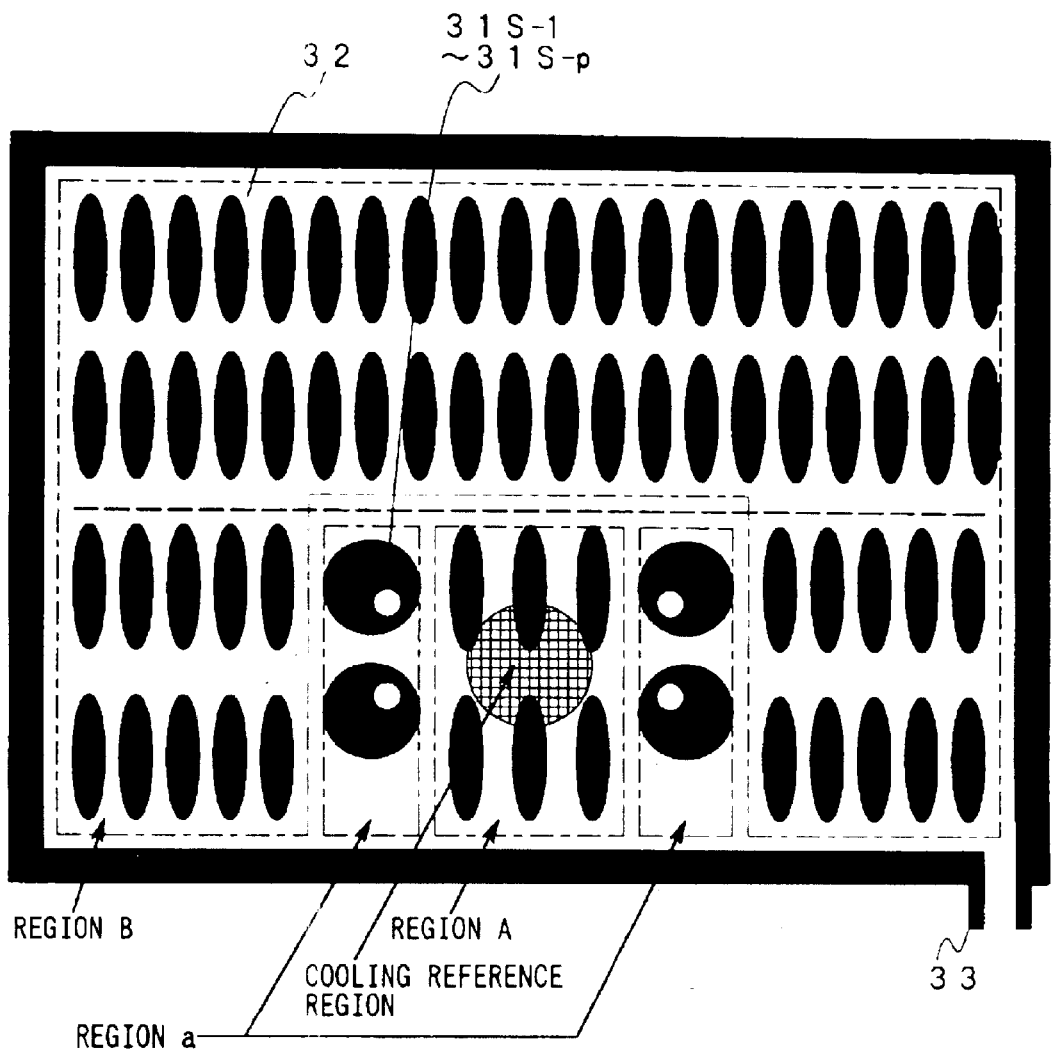
FIG. 7 is a view showing th e second embodiment and a fourth embodiment of the present invention.

FIG. 7 is a view showing a second embodiment and a fourth embodiment of the present invention.

The second embodiment is characterized by the shape and layout of a channel formed in the following manner on a radiating surface as shown in FIG. 7.

In this embodiment, in a region A of the thermal coupling plane 31, to which most of the heat generated in the TLD module 94A is transferred from this TLD module 94A via the case 90C, the channel 32 is formed to have a cross section S and is formed with density D, the cross section S being large and the density D being high to the extent to enable the heat medium which has vaporized due to thus transferred heat to steadily recirculate in sequence via the channel which is formed in each part other than this region A.

As for the projecting parts of the thermal coupling plane 31, which are formed in the aforesaid region A or in a region a near this region A and in which the aforesaid threaded holes 31S-1 to 31S-p are to be formed, cross sections in a direction perpendicular to the axis of the channel 32 and/or cross sections in a direction horizontal to the axis of the channel 32 are formed to be larger than those of the other projecting parts.

Moreover, in a region B other than the aforesaid regions A and a of the thermal coupling plane 31, the channel 32 is formed to have a cross section s smaller than the aforesaid cross section S and it is formed with density d high to the extent causing thermal resistance of the heat sink 96 (the radiation fin) to its periphery to be a prescribed upper limit value or smaller.

In other words, in the region A and the regions a and B, the channel 32 is formed to have the cross section and with the density consistent with both thermal resistance distribution in the each of their corresponding parts of the heat sink 96 and temperature distribution of the exterior of this heat sink 96.

Therefore, the surface temperature of the TLD module 94A is caused to have a lower value than in the above-described first embodiment as shown in FIG. 6(b) even when an excessive amount of the heat medium is not injected into the channel 32.

Incidentally, in this embodiment, the cross section of the channel and the density with which it is formed are common to the regions a and B.

However, the cross section and the density may be determined at any value, for example, when restrictions on cost increase and others due to difference in values among the aforesaid regions A, a, and B are tolerable or are solved separately.

Furthermore, the cross section and/or the density may be determined at an appropriate value which can achieve adaptability, for example, to non-uniform distribution of the thermal resistance of each part of the heat sink 96 and/or non-uniform distribution of the temperature of the exterior (the periphery) of this heat sink 96.

Figure 8:
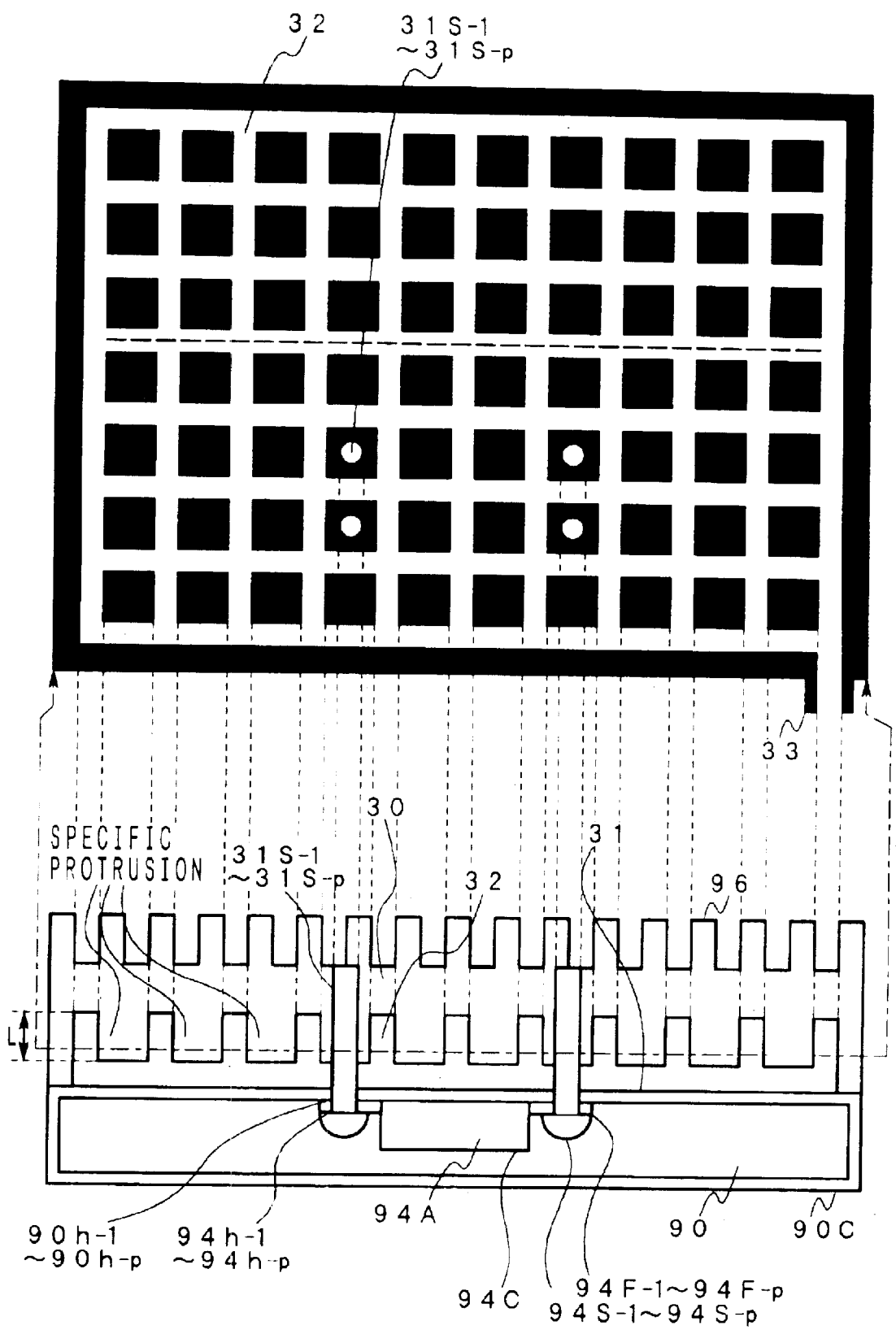
FIG. 8 is a view showing a third embodiment of the present invention.

FIG. 8 is a view showing a third embodiment of the present invention.

This embodiment is characterized in that a length L of all or a part of the projecting parts (these projecting parts are hereinafter referred to simply as 'specific protrusions') except the projecting parts which are formed on the thermal coupling plane 31 and in which the aforesaid threaded holes 31S-1 to 31-S-p are formed is set at "a value small to the extent that allows a channel (hereinafter, referred to as an 'additional channel') to be formed also between the case 90C and these projecting parts".

In this embodiment, the additional channel is formed as a bypass between predetermined sections of the channel 32 and sections adjoining the predetermined sections via the aforesaid specific protrusions.

In other words, the heat medium which is injected into the channel 32 and carries out heat exchange according to the heat transferred from the TLD module 94A recirculates via the channel 32 and the additional channel.

Consequently, in regions of the thermal coupling plane 31, in which the additional channel described above is formed, deviation in temperature distribution is further reduced and efficiency in heat radiation via the heat sink 96 is enhanced.

Incidentally, in this embodiment, the additional channel is formed between flat top parts of the specific protrusions and the case 90C.

However, the additional channel as described above may be formed between top parts of the specific protrusions which are formed, for example, in a wedge shape or a protruding shape and the case 90C or between grooves or slits formed in these top parts and the case 90C.

The fourth embodiment of the present invention is explained below with reference to FIG. 7.

This embodiment is characterized by the amount of the heat medium injected into the channel 32.

Figure 9:
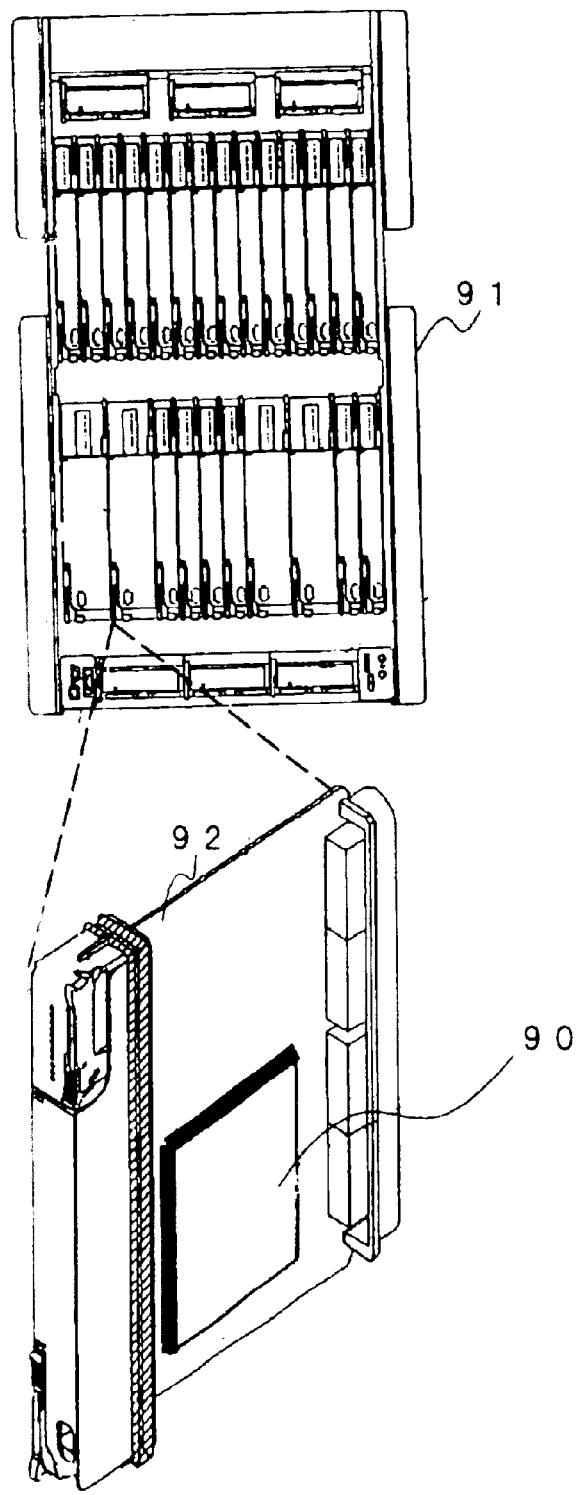
FIG. 9 is a view showing a configuration example of a node in which a tunable OS is mounted.

In this embodiment, the heat medium injection port 33 is positioned in an area, for example, in a direction of a bottom part of a shelf 91 when the tunable OS 90 is mounted in a predetermined slot of the shelf 91 together with the printed circuit board 92 as shown in FIG. 9.

Therefore, the heat medium injected into the channel 32 stays in a section adjoining the closed heat medium injection port 33, out of the sections of the channel 32, when the TLD module 94A is in a state of radiating no heat (hereinafter, referred to as a 'reference state').

Moreover, the volume of the heat medium injected from the exterior via the heat medium injection port 33 is set at such a value to cause the level of the heat medium in the reference state to be in an upper area (corresponding to the upper area on the drawing of FIG. 7) than "a place having the closest thermal coupling with the laser diode 98 generating heat (hereinafter, referred to as a 'cooling reference region'), in the region A", as shown by the broken line in FIG. 7.

Therefore, in the channel formed in the region A including the cooling reference region, some heat medium constantly exists and the heat transferred from the laser diode 98 via this cooling reference region is stably and surely diffused all over the bottom part of the heat sink 96 via this heat medium.

Consequently, according to this embodiment, performance of the tunable OS 90 is stably maintained and its reliability is enhanced compared with a case when the volume of the heat medium to be injected into the channel 32 is not determined based on the relation to the cooling reference region.

Incidentally, in this embodiment, the present invention is applied to the second embodiment described above.

However, the present invention is not limited to the second embodiment described above, and is also applicable, for example, to the first embodiment and the third embodiment described above.

Furthermore, in this embodiment, the aforesaid volume of the heat medium is determined without any consideration given to the cross section, the layout (density), and so on of the channel 32 (may include the additional channel).

However, this volume of the heat medium may be calculated as a value suitable for all or a part of the following based on actual measurement or theory (including simulation).

a recirculation rate of the heat medium in each section of the channel 32 characteristics of vaporization heat and others of the heat medium power supply consumed and converted to heat by the laser diode 98 physical distribution of the characteristic of the radiation fin formed in the heat sink 96 temperature of the periphery adjoining this heat sink 96 via the radiation fin and its temperature distribution.

Furthermore, in each of the above-described embodiments, the channel 32 is shielded from the exterior in a manner that the whole circumference of the marginal part of the thermal coupling plane 31 is brazed to the case 90C and the heat medium injection port 33 is closed.

However, the present invention is not limited to this structure, and when decrease in thermal conductivity between the TLD module 94A and the channel 32 is tolerable, for example, either one of the following structures may be applied to shield the channel 32 from the exterior via some methods other than the heat medium injection port 33 without the above-described brazing.

A plate-shaped structure having an ingredient and a shape which do not impair the thermal coupling between the thermal coupling plane 31 and the case 90C and being brazed to the marginal part of this thermal coupling plane 31 instead of being brazed to the case 90C is provided.

The radiating member 30 is structured as a plurality of frames having a mechanism and a thermal conductivity characteristic equivalent to the combination of the above plate-shaped structure and the radiating member 30 and being integrated by welding or the like.

Moreover, in each of the above-described embodiments, the heat sink 96 is formed integrally with the radiating member 30 as a part of the radiating member 30.

However, the present invention is not limited to the above-described structure, and for example, in either one of the following cases, the radiating member 30 may be structured as a thermal diffuser which does not include the heat sink 96 and simply transfers the heat generated by the TLD module 94A uniformly to the bottom part of the heat sink 96.

when standardization of thermal design adaptable to various heat sinks which can be applied as the heat sink 96 is demanded when radiation to such an extent that operating temperature of the TLD module 94A is maintained in a prescribed range is attained even without the heat sink 96 being provided (including a case when a case (a chassis) of an equipment provided with the TLD module 94A is applied instead of the heat sink 96).

Moreover, in each of the above-described embodiments, the radiating member 30 is fastened to the TLD module 94A (the tunable OS 90) with the screws 94S-1 to 94S-p.

However, when it is permissible that the process of realizing such fastening precedes the assembly process of the TLD module 94A and the tunable OS 90, a package of the TLD module 94A and/or the case 90C may be formed integrally with the radiating member 30.

Furthermore, in each of the above-described embodiments, the heat medium injection port 33 used for injecting the heat medium into the channel 32 (including the additional channel) after the aforesaid brazing is finished is provided.

However, the present invention is not limited to the structure described above, and the heat medium injection port 33 need not be provided when the following conditions are satisfied.

Prior to the process of realizing the shielding of the channel 32 and the additional channel from the exterior, the heat medium is surely injected into the channel 32 and the additional channel.

Heat (difference in atmospheric pressure between the inside and the outside of the channel 32 and the additional channel) which can be given to the heat medium in the process of joint and assembly of the TLD module 94A and the case 90C (including the heat sink 96 when the heat sink 96 is formed as a separate structure from the radiating member 30) is tolerably small, or most of the heat, out of the above heat, which can be transferred to the heat medium existing inside the channel 32 and the additional channel, is radiated to the exterior according to heat shunt or the like separately carried out.

Furthermore, in each of the above-described embodiments, the shape of the cross sections of the channel 32 and the additional channel are rectangular in all the regions of the channel 32 and the additional channel and their sizes are not specified.

However, these cross sections may be formed in any shape as long as the heat generated in the TLD module 94A and transferred to the channel 32 is diffused uniformly all over the thermal coupling plane 31 with a prescribed deviation.

Furthermore, the channel 32 and the additional channel may have cross sections small to the extent so as to allow the capillary attraction acting on the heat medium, for example, according to materials forming wall surfaces of the channel 32 and the additional channel and according to the structure of the heat medium injected into the channel 32 and the additional channel to exceed attraction acting on the heat medium and so as to cause recirculation of the heat medium to be promoted by this capillary attraction, as long as the aforesaid molding and layout of the projecting parts are technically possible.

Moreover, in each of the above-described embodiments, the cross sections of all the projecting parts in the perpendicular direction to the axis of the channel 32 are formed in a rectangular shape, and sizes of these cross sections are not specified.

However, these cross sections may be formed in any shape as long as the heat is diffused uniformly all over the thermal coupling plane 31 within a prescribed deviation range and as long as it is possible to form the channel 32 and the additional channel with cross sections thereof having prescribed sizes and shapes which realize this heat diffusion, and in addition, the shapes and/or the sizes need not be uniform as long as close thermal coupling between the TLD module 94A and the heat sink 96 is achieved within a range in which degradation of mechanical strength is tolerable.

Moreover, in each of the above-described embodiments, nothing is injected except the heat medium into the channel 32 and the additional channel.

However, the present invention is not limited to this structure, and for example, material, such as cotton yarn with its density properly set, which causes the recirculation of the heat medium to be promoted as a whole by increase in the aforesaid capillary attraction even when physical recirculation of the heat medium in the channel 32 and the additional channel is suppressed may be inserted together with this heat medium to the channel 32 and/or the additional channel.

Furthermore, in each of the above-described embodiments, the atmospheric pressure of the channel 32 is set at a lower value than that of the exterior after the heat medium is injected thereto.

However, the present invention is not limited to this structure, and the atmospheric pressure inside the channel 32 need not be reduced at all when a heat medium having vaporization heat and a diffusion rate which enable prescribed heat radiation to be achieved in the same atmospheric pressure as that of the exterior is injected into the channel 32.

Moreover, in each of the above-described embodiments, the present invention is applied to a node in which the tunable OS 90 (the laser diode 98) to undergo heat radiation is mounted.

However, the present invention is not limited to be applied to such an equipment, and is similarly applicable, for example, to all of a thermostatic bath and a cryostat which maintain operating temperature of a desired electronic component and circuit at a predetermined value, and an equipment provided with an electronic component or circuit which is to undergo some cooling.

Furthermore, in each of the above-described embodiments, materials forming the radiating member 30 and the case 90C are not specifically disclosed.

However, when the radiating member 30 and the case 90C are integrated by brazing and other welding as previously described, these materials are not limited to metallic materials such as aluminum, copper, and stainless steel and may be non-metallic materials such as ceramics, plastic, and synthetic resin, and, in addition, the materials used for the both may be different from each other, as long as the materials are appropriate for the welding and the heat medium.

Moreover, any of fusion welding, pressure welding, and diffusion welding is applicable as a welding method substituting for the aforesaid brazing in the present invention, regardless of energy actually applied.

Furthermore, in each of the above-described embodiments, the heat medium to be actually applied is not specifically disclosed.

However, any heat medium such as fluorocarbon, ammonium, and others may be used as this heat medium as long as it is suitable for the aforesaid material forming the channel 32, has vaporization heat large enough to achieve heat diffusion with a prescribed precision, and has a sufficiently high diffusion rate in a vaporized state.

The invention is not limited to the above embodiments and various modifications may be made without departing from the spirit and the scope of the invention. Any improvement may be made in part or all of the components.

What is claimed is:

1. A thermal diffuser comprising:
a plate-like structure having a wall on its fringe, and being thermally conductive and attached to a case of an electronic component by means of welding or bonding with the wall, the electronic component being subjected to heat exchange with an exterior; and
a plurality of protrusions being arranged with spacing on one or both of said wall and said plate-like structure, the spacing among said protrusions forming a channel in a region which is surrounded with said wall, said case, and said plate-like structure and in which a heat medium is confined, the channel being thermally coupled with said case and consisting of web-like paths through which the heat medium recirculates.

2. A thermal diffuser comprising:
a housing being thermally conductive and having an outer wall capable of being thermally coupled with a case of an electronic component which is subjected to heat exchange with an exterior; and
a plurality of protrusions being arranged with spacing on an inner wall of said housing in which a heat medium is confined, the spacing among said protrusions forming a channel being thermally coupled with said case and consisting of web-like paths through which the heat medium recirculates.

3. A thermal diffuser comprising:
a frame being thermally conductive and integrated with a case of an electronic component which is subjected to heat exchange with an exterior; and
a plurality of protrusions being arranged with spacing on an inner wall of said frame in which a heat medium is confined, the spacing among said protrusions forming a channel being thermally coupled with said case and consisting of web-like paths through which the heat medium recirculates.

4. The thermal diffuser according to claim 1, further comprising:
a heat medium injection path formed in said wall of said plate-like structure and used for injection of the heat medium into the channel from the exterior.

5. The thermal diffuser according to claim 2, further comprising:
a heat medium injection path formed in said wall of said plate-like structure and used for injection of the heat medium into the channel from the exterior.

6. The thermal diffuser according to claim 3, further comprising:
a heat medium injection path formed in said wall of said plate-like structure and used for injection of the heat medium into the channel from the exterior.

7. The thermal diffuser according to claim 1, wherein:
said plurality of protrusions being closely arranged in a region, the region being near a device or a circuit which is provided in the electronic component and is subject to the heat exchange.

8. The thermal diffuser according to claim 2, wherein:
said plurality of protrusions being closely arranged in a region, the region being near a device or a circuit which is provided in the electronic component and is subjected to the heat exchange.

9. The thermal diffuser according to claim 3, wherein:
said plurality of protrusions being closely arranged in a region, the region being near a devise or a circuit which is provided in the electronic component and is subjected to the heat exchange.

10. The thermal diffuser according to claim 1, wherein:
said plurality of protrusions being arranged with uniform density in a region, the region being distant from a device or a circuit which is provided in the electronic component and is subjected to the heat exchange.

11. The thermal diffuser according to claim 2, wherein:
said plurality of protrusions being arranged with uniform density in a region, the region being distant from a device or a circuit which is provided in the electronic component and is subjected to the heat exchange.

12. The thermal diffuser according to claim 3, wherein:
said plurality of protrusions being arranged with uniform density in a region, the region being distant from a device or a circuit which is provided in the electronic component and is subjected to the heat exchange.

13. The thermal diffuser according to claim 1, wherein:
top part(s) of all or part of said plurality of protrusions has/have a shape and a size large enough to have said channel pass therethrough.

14. The thermal diffuser according to claim 2, wherein:
top part(s) of all or part of said plurality of protrusions has/have a shape and a size large enough to have said channel pass therethrough.

15. The thermal diffuser according to claim 3, wherein:
top part(s) of all or a part of said plurality of protrusions has/have a shape and a size large enough to have said channel pass therethrough.

16. The thermal diffuser according to claim 1, wherein:
all or part of said plurality of protrusions has/have a partly contracted pillar or wedge shape.

17. The thermal diffuser according to claim 2, wherein:
all or part of said plurality of protrusions has/have a partly contracted pillar or wedge shape.

18. The thermal diffuser according to claim 3, wherein:
all or a part of said plurality of protrusions has/have a partly contracted pillar or wedge shape.

19. The thermal diffuser according to claim 1, wherein:
said plurality of protrusions and/or said wall have a material, a shape, and a size such that recirculation of the heat medium is promoted by capillary attraction in the channel.

20. The thermal diffuser according to claim 2, wherein:
said plurality of protrusions and/or said inner wall have a material, a shape, and a size such that recirculation of the heat medium is promoted by capillary attraction in the channel.

21. The thermal diffuser according to claim 3, wherein:
said plurality of protrusions and/or said inner wall have a material, a shape, and a size such that recirculation of the heat medium is promoted by capillary attraction in the channel.

22. The thermal diffuser according to claim 1, further comprising:

a medium inserted in all or part of sections of the channel, for promoting recirculation of the heat medium by capillary attraction in the channel.

23. The thermal diffuser according to claim 2, further comprising:
a medium inserted in all or part of sections of the channel, for promoting recirculation of the heat medium by capillary attraction in the channel.

24. The thermal diffuser according to claim 3, further comprising:
a medium inserted in all or part of sections of the channel, for promoting recirculation of the heat medium by capillary attraction in the channel.

25. The thermal diffuser according to claim 1, wherein:
all or part of said plurality of protrusions has/have one of a hole and a member, the hole being used for joining and/or coupling the thermal diffuser and said case, the member being used for fastening the thermal diffuser in order to maintain thermal coupling with said case.

26. The thermal diffuser according to claim 2, wherein:
all or part of said plurality of protrusions has/have one of a hole and a member, the hole being used for joining and/or coupling the thermal diffuser and said case, the member being used for fastening the thermal diffuser in order to maintain thermal coupling with said case.

27. The thermal diffuser according to claim 3, wherein:
all or part of said plurality of protrusions has/have one of a hole and a member, the hold being used for joining and/or coupling the thermal diffuser and said case, the member being used for fastening the thermal diffuser in order to maintain thermal coupling with said case.

28. The thermal diffuser according to claim 1, further comprising:
one of a member used for fastening the thermal diffuser in order to maintain thermal coupling with said case, and member(s) integrated with all or a part of said plurality of protrusions individually and used for joining and/or coupling the thermal diffuser and said case.

29. The thermal diffuser according to claim 2, further comprising:
one of a member used for fastening the thermal diffuser in order to maintain thermal coupling with said case, and member(s) integrated with all or part of said plurality of protrusions individually and used for joining and/or coupling the thermal diffuser and said case.

30. The thermal diffuser according to claim 3, further comprising:
one of a member used for fastening the thermal diffuser in order to maintain thermal coupling with said case, and member(s) integrated with all or part of said plurality of protrusions individually and used for joining and/or coupling the thermal diffuser and said case.

31. The thermal diffuser according to claim 1, wherein:
a total amount of the heat medium is set to such an amount that the heat medium steadily recirculates in a part of the channel, the part being most closely thermally coupled with the electronic component.

32. The thermal diffuser according to claim 2, wherein:
a total amount of the heat medium is set to such an amount that the heat medium steadily recirculates in a part of the channel, the part being most closely thermally coupled with the electronic component.

33. The thermal diffuser according to claim 3, wherein:
a total amount of the heat medium is set to such an amount that the heat medium steadily recirculates in a part of the channel, the part being most closely thermally coupled with the electronic component.

34. The thermal diffuser according to claim 1, wherein:
said plate-like structure has a shape and a material such that the said plate-like structure has a desired degree of thermal coupling with the exterior or a specific member.

35. The thermal diffuser according to claim 2, wherein:
said outer wall has a shape and a material such that the said plate-like structure has a desired degree of thermal coupling with the exterior or a specific member.

36. The thermal diffuser according to claim 3, wherein:
the outer wall of said frame has a shape and a material such that the said plate-like structure has a desired degree of thermal coupling with the exterior or a specific member.

37. A radiator comprising:
a thermal diffuser comprising a plate-like structure having a wall on its fringe, and being thermally conductive and attached to a case of an electronic component by means of welding or bonding with the wall, the electronic component being subject to heat exchange with an exterior; and a plurality of protrusions being arranged with spacing on one or both of said wall and said plate-like structure, the spacing among said protrusions forming a channel in a region which is surrounded with said wall, said case, and said plate-like structure and in which a heat medium is confined, the channel being thermally coupled with said case and consisting of web-like paths through which the heat medium recirculates; and a radiating member thermally coupled with an outer wall of said thermal diffuser, for radiating heat to an exterior, the heat being transferred via said thermal diffuser.

38. A radiator comprising:
a thermal diffuser comprising a housing being thermally conductive and having an outer wall capable of being thermally coupled with a case of an electronic component which is subjected to heat exchange with an exterior; and a plurality of protrusions being arranged with spacing on an inner wall of said housing in which a heat medium is confined, the spacing among said protrusions forming a channel being thermally coupled with said case and consisting of web-like paths through which the heat medium recirculates; and a radiator member thermally coupled with an outer wall of said thermal diffuser, for radiating heat to the exterior, the heat being transferred via said thermal diffuser.

39. A radiator comprising:
a thermal diffuser comprising a frame being thermally conductive and integrated with a case of an electronic component which is subjected to heat exchange with an exterior; and a plurality of protrusions being arranged with spacing on an inner wall of said frame in which a heat medium is confined, the spacing among said protrusions forming a channel being thermally coupled with said case and consisting of web-like paths through which the heat medium recirculates; and a radiating member thermally coupled with an outer wall of said thermal diffuser, for radiating heat to the exterior, the heat being transferred via said thermal diffuser.

40. A radiator comprising:
a thermal diffuser comprising a plate-like structure having a wall on its fringe, and being thermally conductive and attached to case of an electronic component by means of welding or bonding with the wall, the electronic component being subjected to heat exchange with an exterior; and a plurality of protrusions being arranged with spacing on one or both of said wall and said plate-like structure, the spacing among said protrusions forming a channel in a region which is surrounded with said wall, said case, and said plate-like structure and in which a heat medium is confined, the channel being thermally coupled with said case and consisting of web-like paths through which the heat medium recirculates; and a radiating member integrally formed on an outer wall of said thermal diffuser, for radiating heat to the exterior, the heat being transferred via said thermal diffuser.

41. A radiator comprising:

a thermal diffuser comprising a housing being thermally conductive and having an outer wall capable of being thermally coupled with a case of an electronic component which is subjected to heat exchange with an exterior; and a plurality of protrusions being arranged with spacing on an inner wall of said housing in which a heat medium is confined, the spacing among said protrusions forming a channel being thermally coupled with said case and consisting of web-like paths through which the heat medium recirculates; and a radiating member integrally formed on an outer wall of said thermal diffuser, for radiating heat to the exterior, the heat being transferred via said thermal diffuser.

42. A radiator comprising:

a thermal diffuser comprising a frame being thermally conductive and integrated with a case of an electronic component which is subjected to heat exchange with an exterior; and a plurality of protrusions being arranged with spacing on an inner wall of said frame in which a heat medium is confined, the spacing among said protrusions forming a channel being thermally coupled with said case and consisting of web-like paths through which the heat medium recirculates; and a radiating member integrally formed on an outer wall of said thermal diffuser, for radiating heat to the exterior, the heat being transferred via said thermal diffuser.

* * * * *